(12) United States Patent
Hayashi et al.

(10) Patent No.: US 6,277,684 B1
(45) Date of Patent: Aug. 21, 2001

(54) METHOD OF FABRICATING A SOI STRUCTURE SEMICONDUCTOR DEVICE

(75) Inventors: Hirokazu Hayashi; Kouichi Fukuda; Noriyuki Miura, all of Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/519,856

(22) Filed: Mar. 6, 2000

(30) Foreign Application Priority Data

Apr. 26, 1999 (JP) ................................................. 11-117447

(51) Int. Cl.⁷ .................... H01L 21/8238; H01L 29/06
(52) U.S. Cl. ........................ 438/225; 438/149; 438/151
(58) Field of Search .................... 438/149, 151, 438/152, 153, 154, 225

(56) References Cited

U.S. PATENT DOCUMENTS

| | | | |
|---|---|---|---|
| 4,842,675 | * 6/1989 | Chapman et al. | 156/643 |
| 5,504,034 | * 4/1996 | Rapisarda et al. | 438/424 |
| 5,736,451 | * 4/1998 | Gayet | 438/443 |
| 5,814,551 | * 9/1998 | Park et al. | 438/448 |
| 5,837,378 | * 11/1998 | Mathews et al. | 438/439 |
| 5,874,325 | * 2/1999 | Koike | 438/143 |
| 6,033,941 | * 3/2000 | Yang | 438/163 |
| 6,087,241 | * 7/2000 | St Amand et al. | 438/400 |

FOREIGN PATENT DOCUMENTS

| | | | |
|---|---|---|---|
| 019548076A1 | * 6/1996 | (DE) | H01L/29/786 |
| 000442296A2 | * 8/1991 | (EP) | H01L/27/092 |
| 001049172A2 | * 2/2000 | (EP) | H01L/29/06 |

* cited by examiner

Primary Examiner—Charles Bowers
Assistant Examiner—David S Blum
(74) Attorney, Agent, or Firm—Jones Volentine, PLLC

(57) ABSTRACT

A SOI structure semiconductor device includes a silicon substrate (1), an insulating oxide layer (2) formed on the silicon substrate (1), a SOI layer (3) formed on the insulating oxide layer (2) a LOCOS oxide layer (4) formed on the insulating oxide layer (2) and contacting with the SOI layer (3) in order to insulate the SOI layer (3), a gate insulation layer (5) formed on the SOI layer (3) and a gate electrode (6) formed on the gate insulation layer (5). The SOI layer (3) has a sectional triangle portion (10) contacting with the LOCOS oxide layer (4). The sectional triangle has an oblique side (12) as a boundary between the SOI layer (4) and the LOCOS oxide layer (3), a height side (13) equal to the thickness of the SOI layer (3) and a base on the lower boundary of the SOI layer (3), in which the ratio of the height side (13) to the base is 4:1 or less.

27 Claims, 15 Drawing Sheets

(A)

(B)

METHOD OF FABRICATING A SOI STRUCTURE SEMICONDUCTOR DEVICE

BACKGROUND OF THE INVENTION

This invention relates to a semiconductor device using a SOI (Silicon On Insulator) substrate, and more particularly to a device structure in which this feature is employed in the silicon layer portion of the semiconductor device.

In a SOI substrate, a silicon layer is formed on a layer with insulation properties, a so-called BOX oxide layer. This silicon layer is isolated by a trench structure or a LOCOS (Local Oxidation of Silicon) method in order to isolate the device. The trench method in which a groove is formed by the silicon layer being etched and an oxide layer being deposited in the groove is disclosed in "IEEE ELECTRON DEVICE LETTERS, VOL. 6, JUNE, 1995," and others. The cost of isolation using the trench structure is high because the number of processes required for trench structure formation is greater than the LOCOS method.

The device isolation for SOI by the LOCOS method is disclosed in "Proceedings IEEE Intr. SOI conf., 116 (1995)." According to the LOCOS method, a thin silicon layer the sectional shape of which is a triangle is formed between a LOCOS oxide layer and a BOX oxide layer and this layer forms the parasite MOSFET. This parasite MOSFET influences significantly the current property of the original (on the assumption that there is no MOSFET) MOSFET. This influence is called a bump property because it looks like a bump is made on the current properties. The threshold voltage for which the parasite MOSFET exists is lower than the original MOSFET.

SUMMARY OF THE INVENTION

The object of the present invention is to provide a semiconductor device of SOI structure which cannot easily form a parasite MOSFET.

To achieve the above described object, a SOI structure semiconductor device includes a silicon substrate, an insulating oxide layer formed on the silicon substrate, a SOI layer formed on the insulating oxide layer a LOCOS oxide layer formed on the insulating oxide layer and contacting with the SOI layer in order to insulate the SOI layer, a gate insulation layer formed on the SOI layer and a gate electrode formed on the gate insulation layer. The SOI layer has a sectional triangle portion contacting with the LOCOS oxide layer. The sectional triangle has an oblique side as a boundary between the SOI layer and the LOCOS oxide layer, a height side equal to the thickness of the SOI layer and a base on the lower boundary of the SOI layer, in which the ratio of the height side to the base is 4:1 or less.

DETAILED DESCRIPTION OF THE PREFERRED EMBODIMENT

Figure 1:
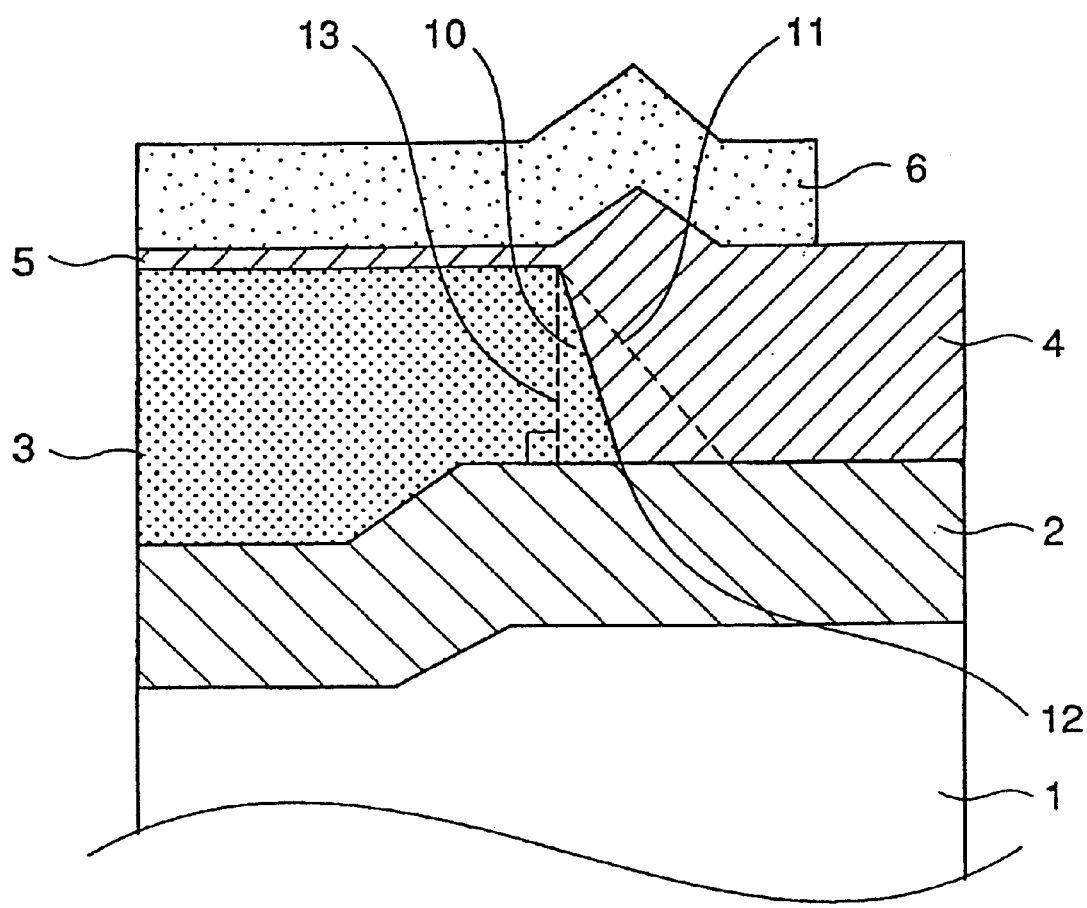
FIG. 1 is a part of a sectional view of a SOI device structure of the first preferred embodiment of the present invention.

FIG. 1 is a part of a sectional view of a SOI device structure of the first preferred embodiment of the present invention. A SOI layer 3 is a silicon layer, the thickness of which is 400 to 500 angstroms is formed on a BOX oxide layer 2, the thickness of which is approximately 400 to 500 angstroms, which is formed on a silicon substrate 1. A part of the SOI layer 3 is oxidized by a LOCOS method and becomes a LOCOS oxide layer 4, the layer thickness of which is approximately 400 angstroms. A gate oxide layer 5 the layer thickness of which is relatively thin (in the vicinity of approximately 70 angstroms) is formed on the SOI layer 3. Polysilicon 6, the layer thickness of which is 2500 to 3000 angstroms, functioning as the gate, is provided on the gate oxide layer 5.

The boundary 10 between the SOI layer 3 and the LOCOS oxide layer 4 has a shape more likely to be perpendicular than the conventional boundary line 11. To give an actual example, in the SOI device structure of the first embodiment, the ratio of the base (the boundary 12) to the height (the perpendicular line 13) of the triangle portion formed by the boundary 12 between the BOX oxide layer 2 and the SOI layer 3, a perpendicular line 13 of the SOI layer 3 in the thickness direction, and the distance from a cross point of the perpendicular line and the bottom of the SOI layer 3 to the boundary 10 between the SOI layer 3 and the LOCOS oxide layer 4 is determined as 1:4 or the ratio of the base itself is less than this.

Figure 2:
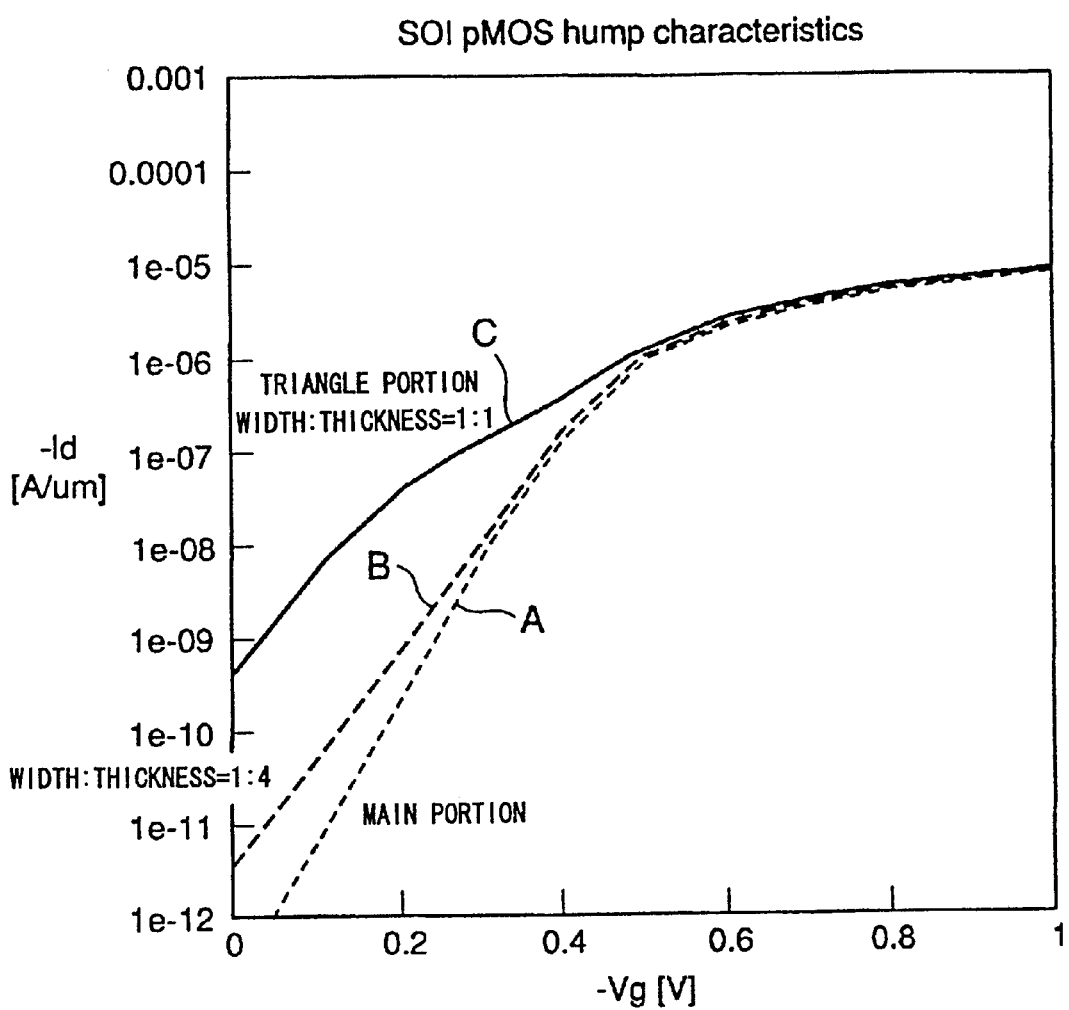
FIG. 2 is a view showing simulation results of current voltage characteristics of a SOI device structure of the first preferred embodiment.
Figure 3:
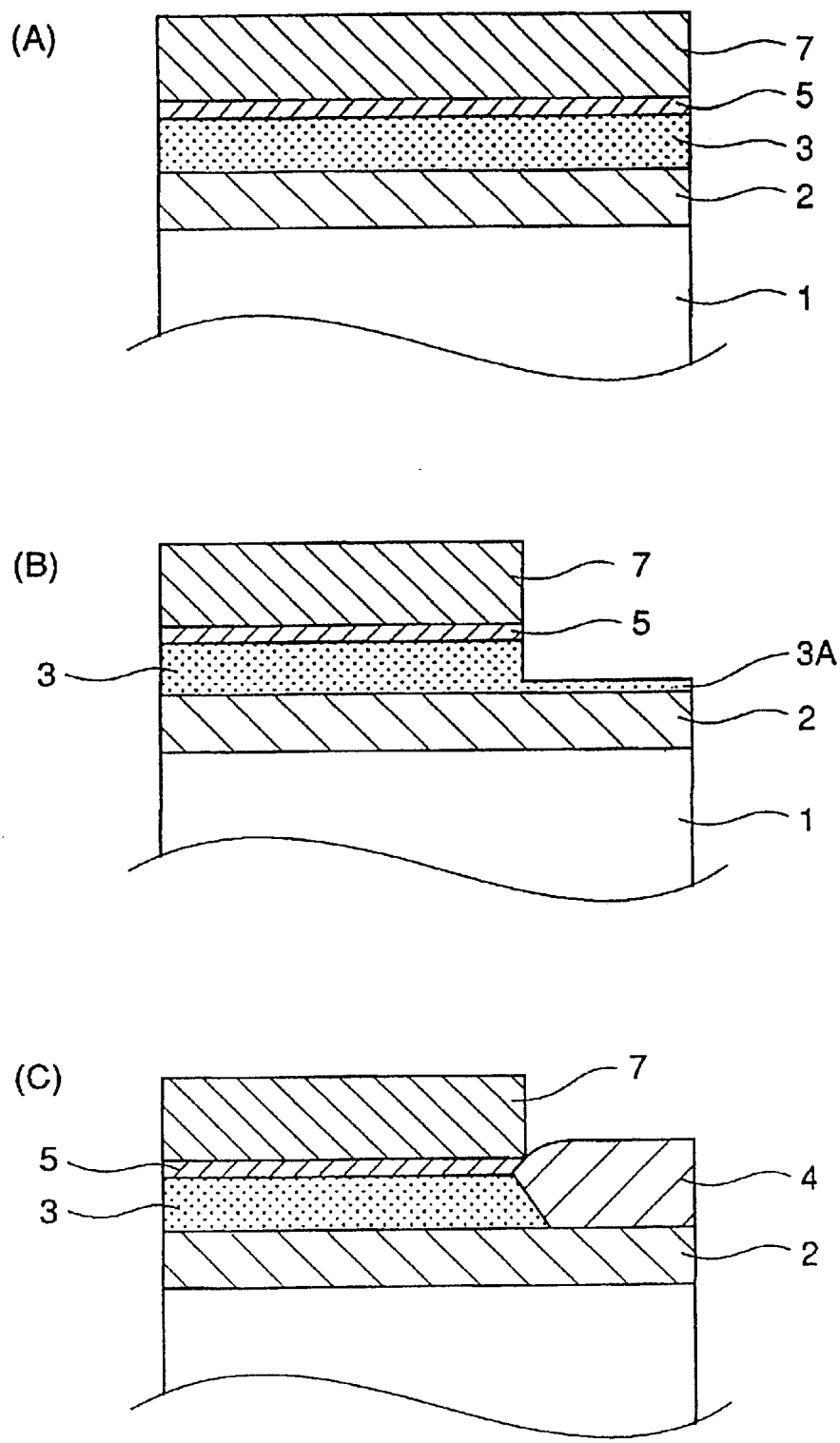
FIGS. 3A–C is a sectional view showing a fabrication method of a SOI device structure of the first preferred embodiment.
Figure 4:
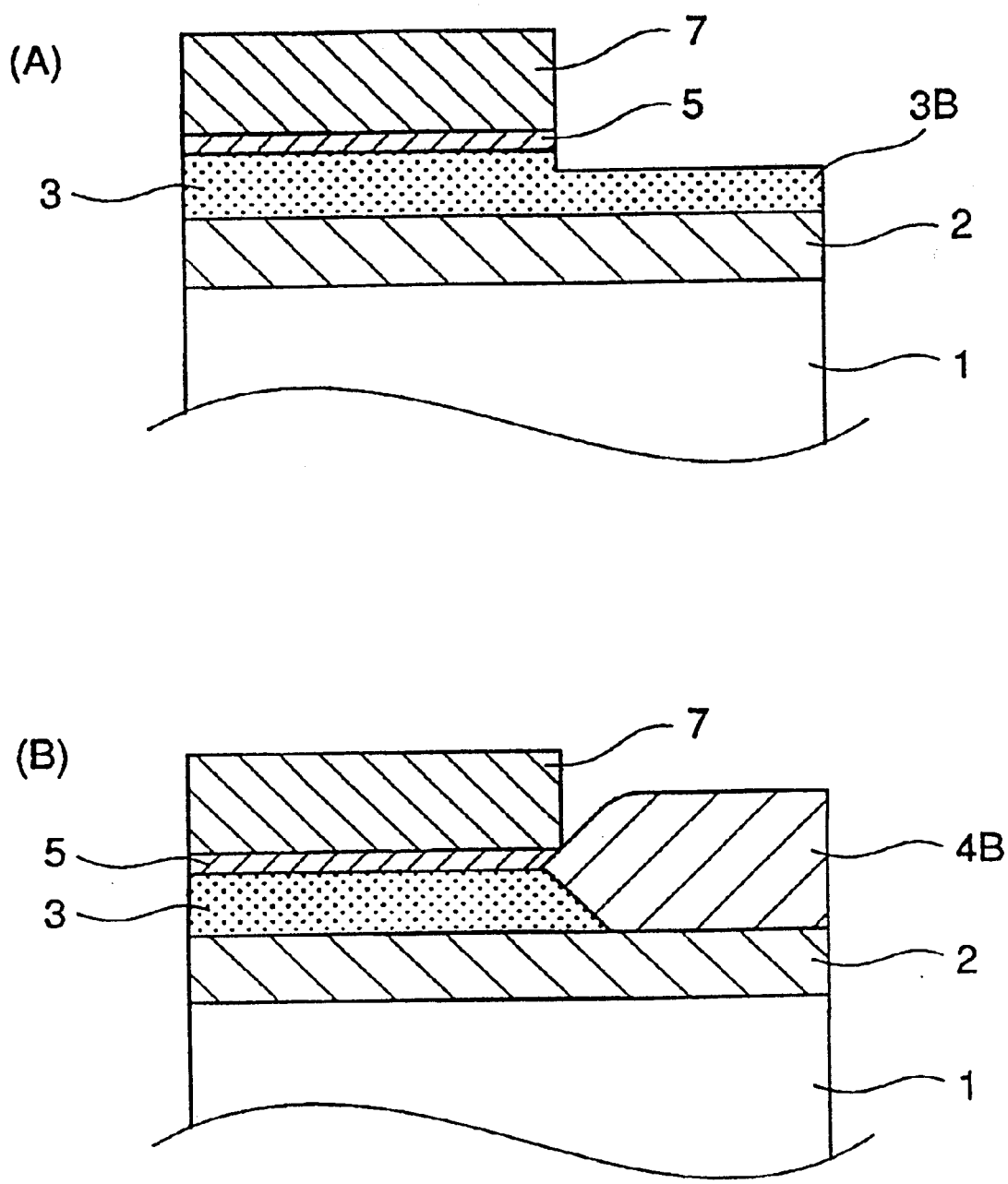
FIGS. 4A–C is a sectional view showing fabrication processes contrasting with the first preferred embodiment.
Figure 5:
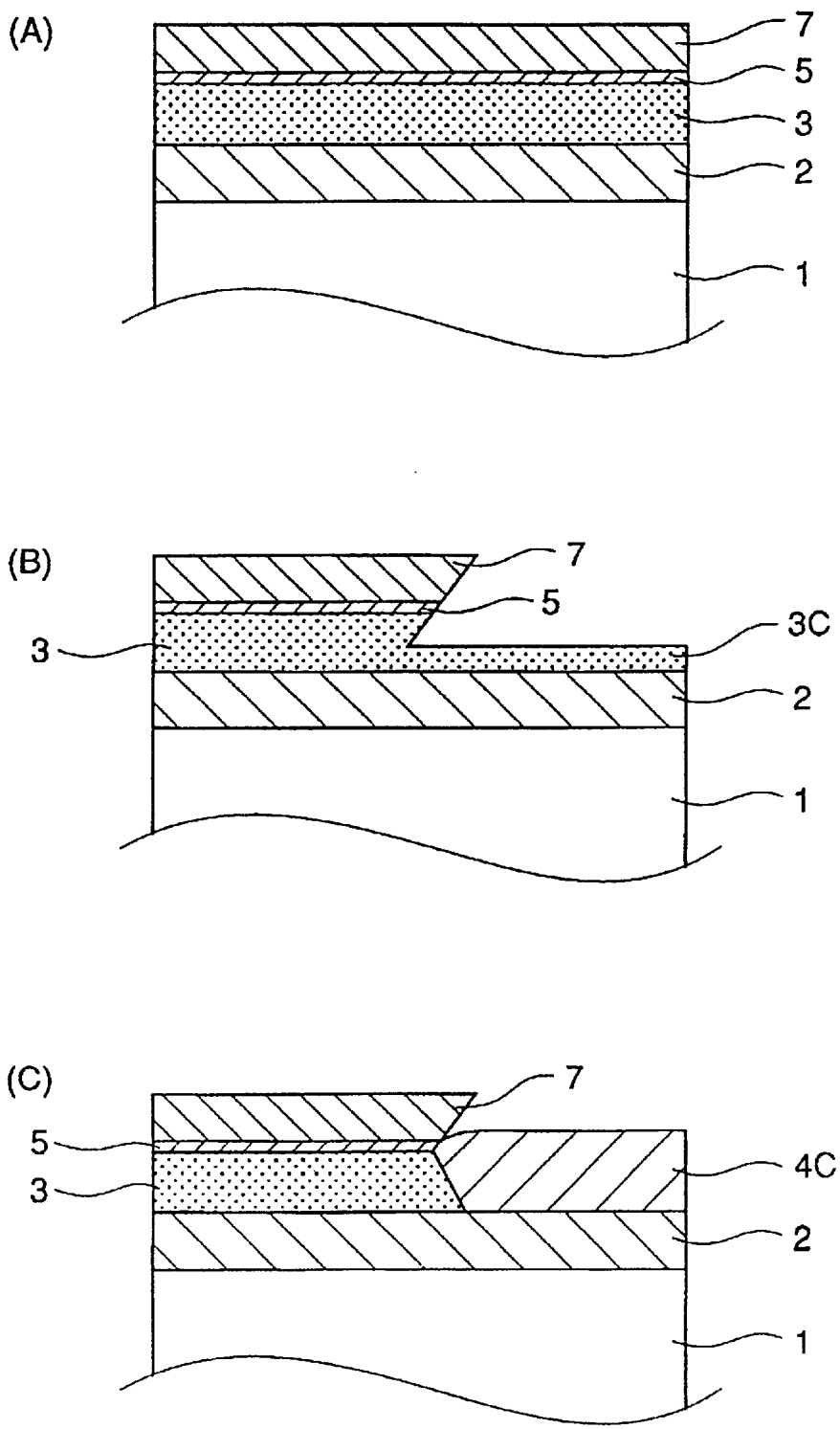
FIGS. 5A–C is a sectional view showing another fabrication method of a SOI device structure of the first preferred embodiment.

According to this type of structure, suppression of the influence caused by a parasite transistor may be expected. FIG. 2 is a view showing simulation results of a current voltage characteristic of a SOI device structure of the first preferred embodiment. Drain current Id is plotted on the vertical axis and gate bias current Vg is plotted on the horizontal axis. In FIG. 2, 1e-05 means $1 \times 10^{-5}$. Compared with the ideal current properties "A" where the parasite transistor is not formed, the off-leak current of the current property "B" of the first embodiment is restrained within one digit. Compared with the current properties "C" where the ratio of the base to the height of the triangle portion of SOI structure is 1:1, a remarkable improvement is apparent and it is possible to verify according to FIG. 2 that this is the same as the ideal current property "A".

FIGS. 3(A) to 3(C) are sectional views showing a fabrication method of a SOI device structure of the first preferred embodiment. Referring to these Figures, a fabrication method of a SOI device structure of the first preferred embodiment is explained hereinafter.

First of all, a SIMOX (Separation by Implementation of Oxygen) substrate is prepared in which the BOX oxide layer 2 the layer thickness of which is approximately 1000 to 1500 angstroms and the SOI layer 3 the layer thickness of which is approximately 500 angstroms are layered and formed. The gate oxide layer 5 the layer thickness of which is 70 angstroms and a nitride layer 7 the layer thickness of which is 500 angstroms are successively formed on the SOI layer 3 of the SIMOX substrate (FIG. 3(A)). The layer thickness of the SOI layer 3 decreases to approximately 400 angstroms due to the gate oxide layer 5 being formed, successive processing, and so forth.

Next, a part of the SOI layer 3, the gate oxide layer 5, and the nitride layer 7 of the portion composing the LOCOS oxide layer is eliminated (FIG. 3(B)). The volume of the SOI layer 3 eliminated corresponds to a thickness of approximately 300 angstroms which is ¾ of the original layer thickness of approximately 400 angstroms. Thus, the layer thickness of a SOI layer 3A after elimination becomes 100 angstroms which is ¼ of the layer thickness of the original SOI layer 3.

After this, the SOI layer 3A is transformed to the LOCOS oxide layer 4 by implementation of the LOCOS oxide process (FIG. 3(C)). The triangle portion of the SOI layer 2 formed in the boundary portion between the BOX oxide layer 2 and the transformed SOI layer 3 decreases and the ratio of the base to the height becomes 1:4 or the ratio of the base becomes smaller.

FIGS. 4(A) and 4(B) are sectional views showing fabrication processes contrasting with the first preferred embodiment. The process of FIG. 4(A) corresponds to FIG. 3(B) and the volume of the SOI layer 3 eliminated is defined as approximately 80 angstroms which is ⅕ of the original layer thickness of approximately 400 angstroms. Thus, the layer thickness of a SOI layer 3B after elimination becomes approximately 320 angstroms which is ⅘ of the layer thickness of the original SOI layer 3.

After this, the SOI layer 3B is transformed to a LOCOS oxide layer 4B by implementation of the LOCOS oxide process (FIG. 4(B)). The triangle portion of the SOI layer 3 formed in the boundary portion between the SOI layer 3 and the transformed LOCOS oxide layer 4B grows far into the LOCOS oxide layer 4B, thus the ratio of the base to the height becomes approximately 1:1.

It is generally acknowledged that the volume ratio of silicon eroded into the oxide layer and extending upward is 0.44:0.56. Because of this, when the layer thickness of the SOI layer 3A transformed into the LOCOS oxide layer 4 is thin, the length (the volume of the portion extending into the LOCOS oxide layer 4) of the base of the triangle portion of the boundary portion can be kept short.

FIGS. 5(A) to 5(C) are sectional views showing another fabrication method of a SOI device structure of the first preferred embodiment. Referring to these figures, another fabrication method of a SOI device structure of the first preferred embodiment is explained.

First of all, the SIMOX substrate is prepared, in which the SOI layer 3 the layer thickness of which is approximately 500 angstroms and the BOX oxide layer 2 the layer thickness of which is approximately 1000 to 1500 angstroms are layered and formed on the silicon substrate. The gate oxide layer 5 the layer thickness of which is approximately 70 angstroms and the nitride layer 7 the layer thickness of which is approximately 500 angstroms are formed successively on the SOI layer 3 of the SIMOX substrate (FIG. 5(A)). The layer thickness of the SOI layer 3 decreases to approximately 400 angstroms because of the formation of the gate oxide layer 5 and the subsequent processing implemented.

Next, the part of the nitride layer 7 forming the LOCOS oxide layer, the gate oxide layer 5, and the SOI layer 3 is removed. The nitride layer 7, the gate oxide layer 5, and the SOI layer 3 are eliminated by oblique etching (FIG. 5(B)). The oblique etching may be implemented by a reactive ion etching method, etc. With regard to the volume of the SOI layer 3 eliminated by this oblique etching, it is not necessary that etching is implemented as far as approximately ¾ of the original layer thickness as already explained in the fabrication method shown in FIG. 3. Although the volume of the SOI layer 3 being eliminated depends on the etching condition, it is appropriate that layer, the thickness of which is approximately 200 angstroms which is approximately ½ of the original layer thickness is eliminated.

After this, a part of the SOI layer 3C is transformed to the LOCOS oxide layer 4C by implementation of the LOCOS oxide process. Since the triangle portion of the SOI layer 3 formed in the boundary portion between the SOI layer 3 and the LOCOS oxide layer 4C is over-etched by oblique etching, it decreases and the ratio of the base to the height becomes 1:4 or the ratio of the base becomes smaller than this ratio.

Figure 6:
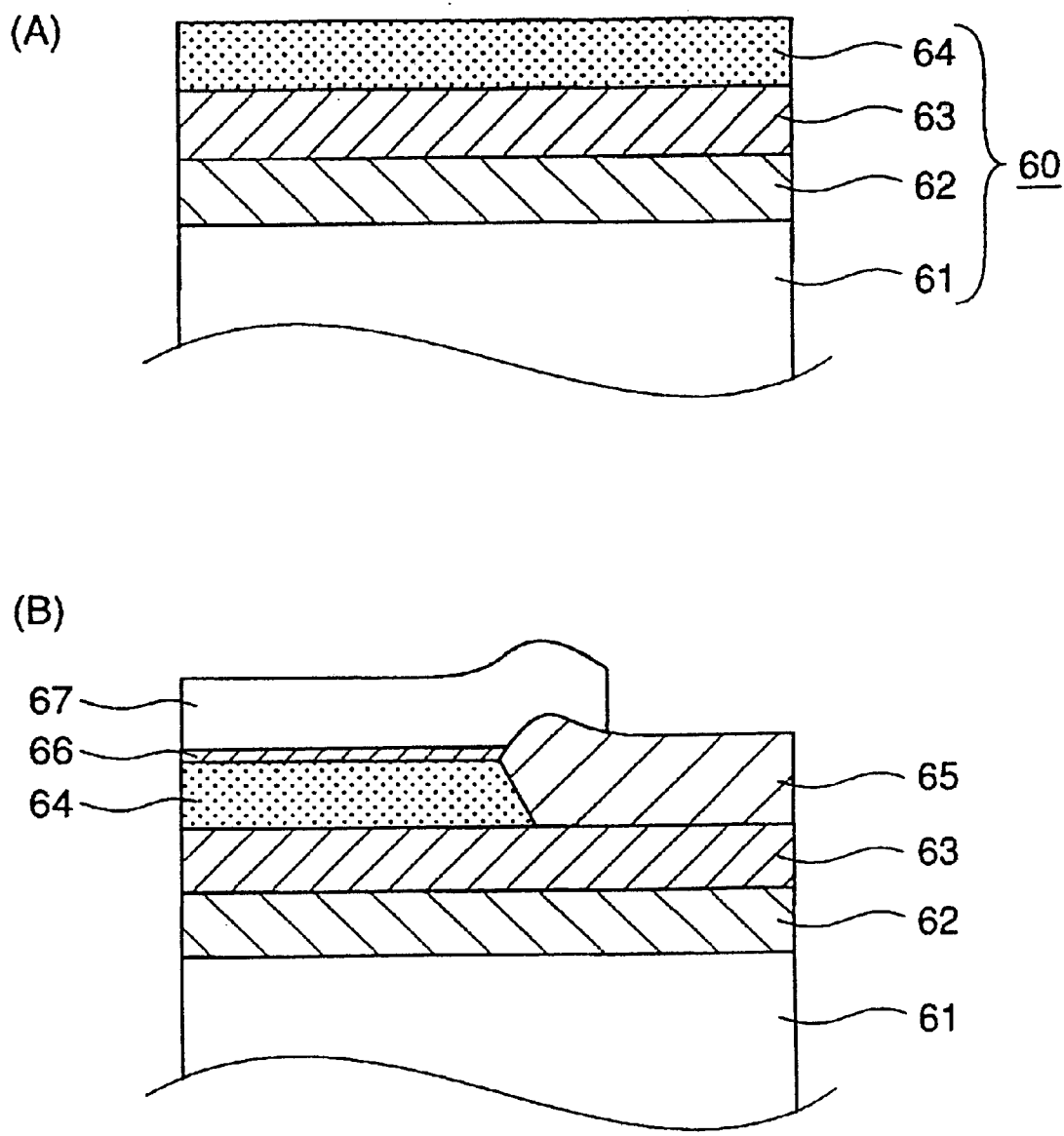
FIGS. 6A–B is a part of a sectional view of a SOI device structure of the second preferred embodiment.

FIGS. 6(A) and 6(B) are partial sectional views showing a SOI device structure of the second preferred embodiment. As shown in FIG. 6(A), for a SOI substrate 60 employed in the second embodiment, a nitride layer 63 the layer thickness of which is approximately 1150 angstroms is formed on a BOX oxide layer 62 the layer thickness of which is approximately 1000 to 1500 angstroms which is formed on a silicon substrate 61.

A SOI layer 64 the layer thickness of which is approximately 500 angstroms is formed on the nitride layer 63. A part of the SOI substrate 60 is oxidized by the LOCOS method and then a part of the SOI layer 64 becomes a LOCOS oxide layer 65 the layer thickness of which is approximately 400 angstroms. A gate oxide layer 66 the layer thickness of which is comparatively thin is formed on the SOI layer 64, and polysilicon 67 functioning as a gate is formed on a gate oxide layer 66 (FIG. 6(B)).

When the SOI layer 3 is oxidized and transformed to the LOCOS oxide layer 4, according to the conventional method, the LOCOS oxide layer forms and is connected to the BOX oxide layer 2. The SOI layer 3 as the device portion (channel portion) is then oxidized in the upward direction from the BOX oxide layer 2.

Figure 7:
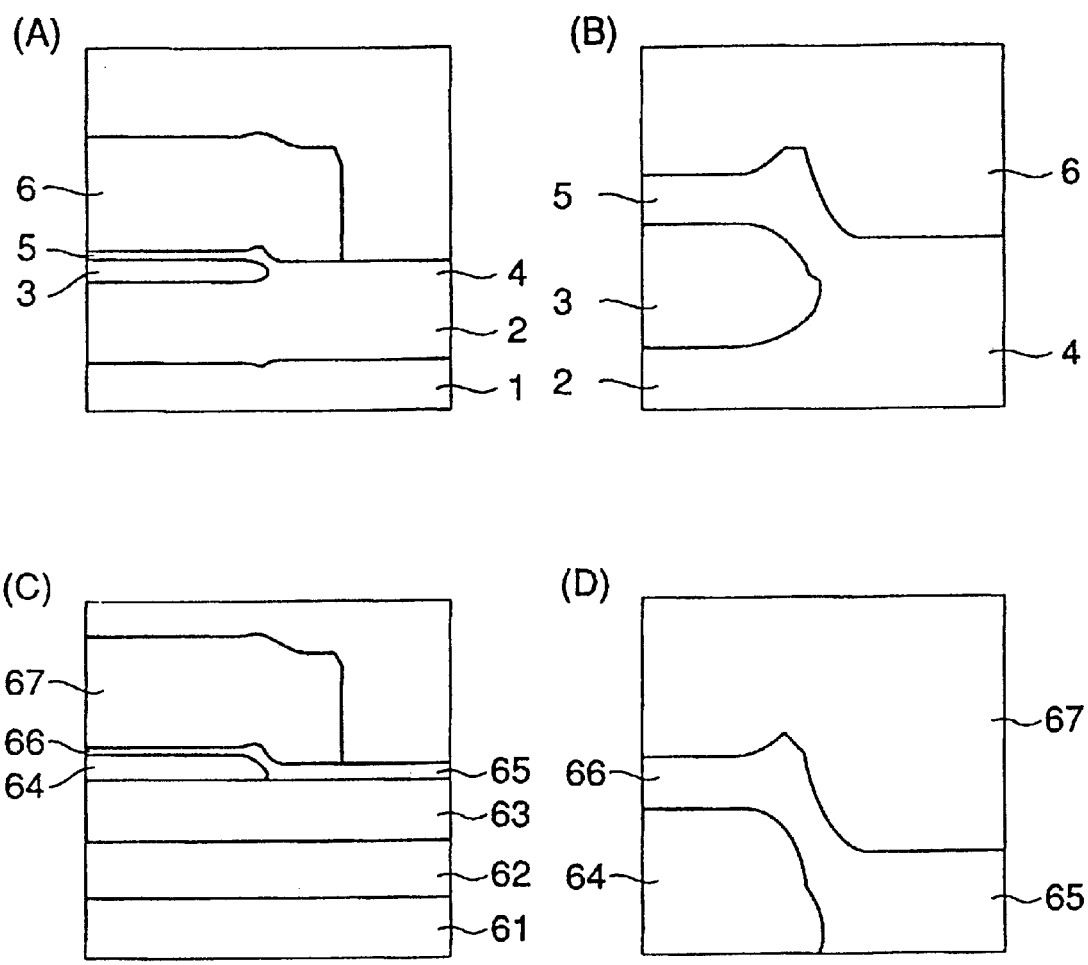
FIGS. 7A–D is a view showing simulation results of current voltage characteristics of a SOI device structure of the second preferred embodiment.

As a result of this phenomenon, the SOI layer 3 becomes a so-called floating state, as the simulation results indicate. As shown in FIG. 7(A) and FIG. 7(B) which is a sectional view of the main parts of FIG. 7(A), a thin SOI layer is formed in the boundary portion between the SOI layer 3 and the LOCOS oxide layer 4.

For the SOI substrate employed in the second embodiment, however, the nitride layer 63 is formed on the BOX oxide layer 62. Since the nitride layer does not accelerate oxidization of the silicon layer to the oxide layer, it cannot be verified that the phenomenon in which the SOI layer 64 of the device portion (channel portion) is oxidized in the upward direction from the nitride layer 63 does not occur. Thus, as the simulation results indicate as shown in FIG. 7(C) and FIG. 7(D) which is a sectional view of main parts of FIG. 7(C), since oxidization from the lower portion is not implemented even in the boundary portion between the SOI layer 65 and the SOI layer 64, the SOI layer 64 is formed comparatively thick.

As explained above, since the nitride layer 63 is formed between the BOX oxide layer 62 and the SOI layer 64, oxidation the direction of which is from the lower portion of the SOI layer 64 is capable of being restrained. The layer thickness of the SOI layer 64 of the boundary portion between the SOI layer 64 and the LOCOS oxide layer 65 is therefore capable of being maintained. Further, since the BOX oxide layer 62 is under the nitride layer 63, it is expected that leakage problems based on the rigid properties of the nitride layer can be decreased by stress relaxation due to the oxide layer.

FIGS. 8(A) to 8(D) are sectional views showing a fabrication method of a SOI device structure of the second embodiment. Referring to these figures, a fabrication method of a SOI device structure of the second preferred embodiment is explained.

Figure 8:
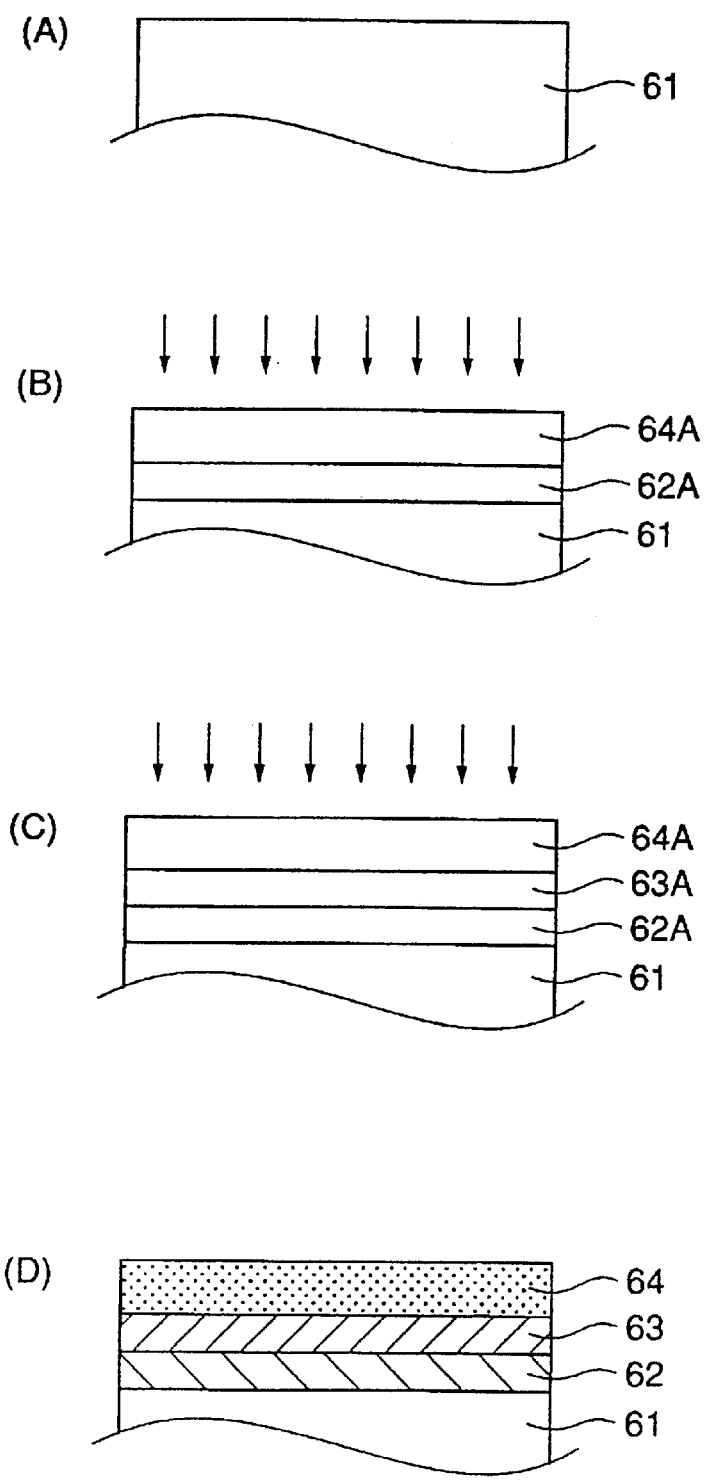
FIGS. 8A–D is a sectional view showing a fabrication method of a SOI device structure of the second preferred embodiment.

First of all, an oxygen ion is injected into the silicon substrate 61 (FIG. 8(A)) which has already been prepared. An oxygen containing layer 62A is formed in a predetermined deep portion of the silicon substrate 61 by this ion injection, and a silicon layer 64A remains on the surface (FIG. 8(B)). The oxygen ion injection is controlled in order for the oxygen containing layer 62A to be formed in a portion the depth of which is approximately 1650 to 3150 angstroms. Next, a nitride ion is injected into the silicon substrate 61 in which the oxygen containing layer 62A has been formed. A nitride containing layer 63A is formed on the oxygen containing layer 62A by this ion injection (FIG. 8(C)). Since the nitride layer 63 has a characteristic of being warped by heat treatment, the nitride ion injection is controlled to control the layer thickness of the nitride containing layer 63A at approximately 1150 angstroms, which is 500 to 1650 angstroms from the surface.

Then, the oxygen containing layer 62A is transformed into the BOX oxide layer 62, the nitride containing layer 63A is transformed into the nitride layer 63, and the SOI substrate that is a prerequisite to FIG. 6(A) is formed by the application of heat treatment (FIG. 8(D)).

Figure 9:
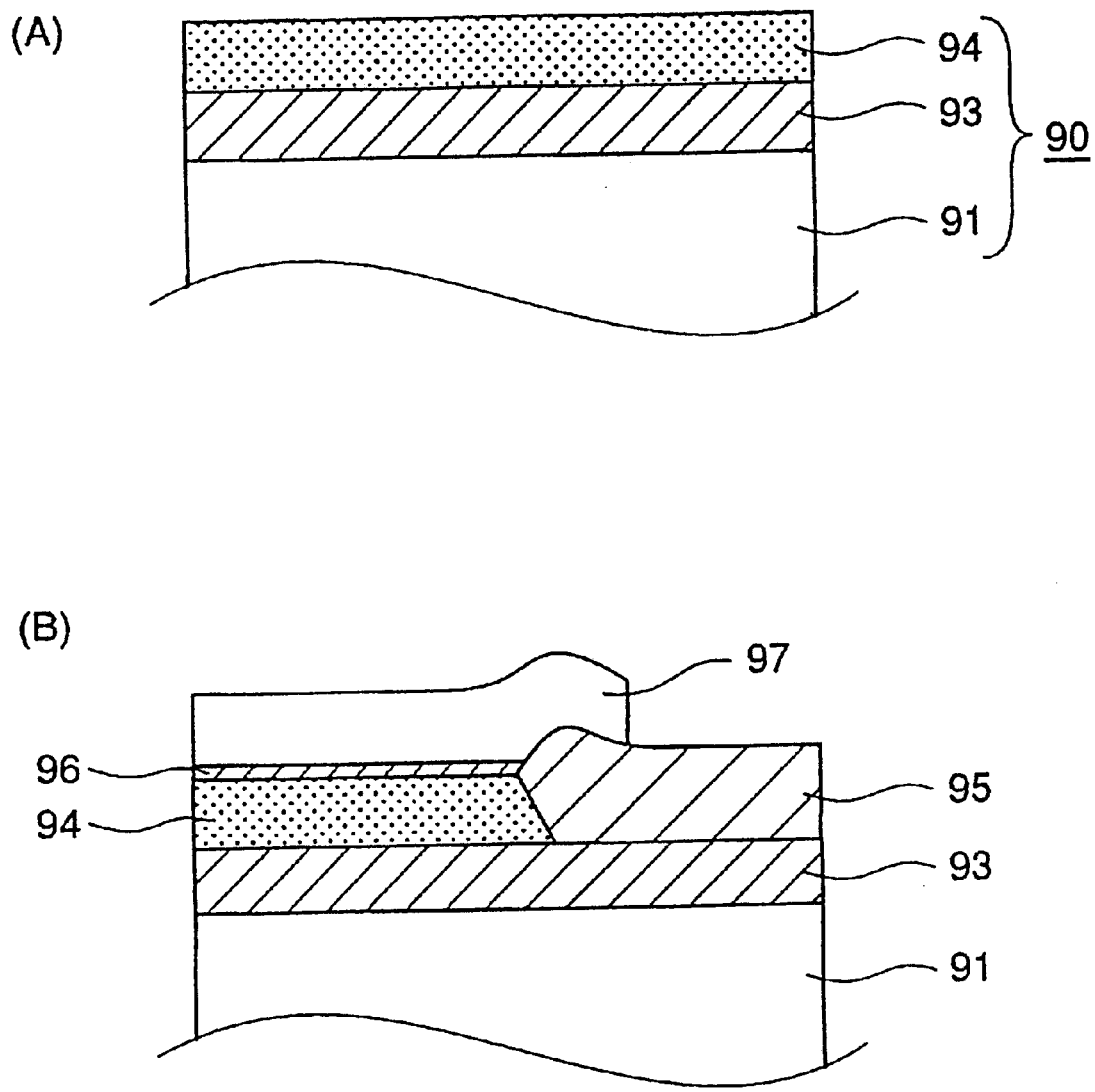
FIGS. 9A–B is a partial sectional view of a SOI device structure of the third preferred embodiment.

FIGS. 9(A) and 9(B) are partial sectional views of a SOI device structure of the third preferred embodiment. As shown in FIG. 9(A), a nitride layer 93 the thickness of which is approximately 1150 angstroms is formed as a SOI substrate 90 employed in the preferred embodiment. A SOI layer 94 the layer thickness of which is approximately 500 angstroms is formed on the nitride layer 93. A part of the SOI substrate 90 employed in the third embodiment is oxidized by the LOCOS method, and a part of the SOI layer 94 becomes a LOCOS oxide layer 95 the layer thickness of which is 400 angstroms. A comparatively thin gate oxide layer 96 the layer thickness of which is approximately 70 angstroms is formed on the SOI layer 94. A Polysilicon layer 97 functioning as the gate, the layer thickness of which is 2500 to 3000 angstroms is provided on the gate oxide layer 96(FIG. 9(B)).

Figure 10:
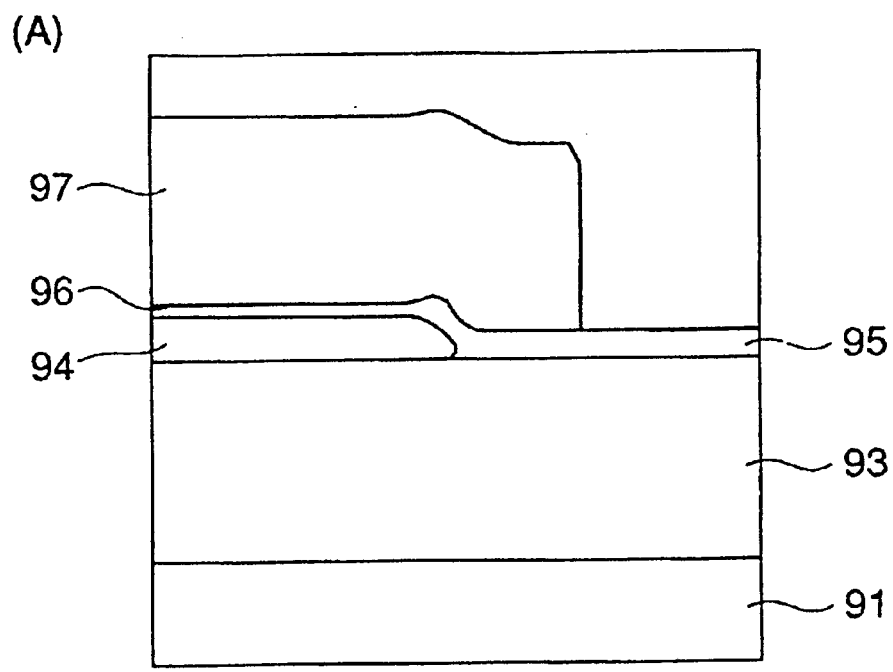
FIGS. 10A–B is a view showing simulation results of current voltage characteristics of a SOI device structure of the third preferred embodiment.
Figure 10:
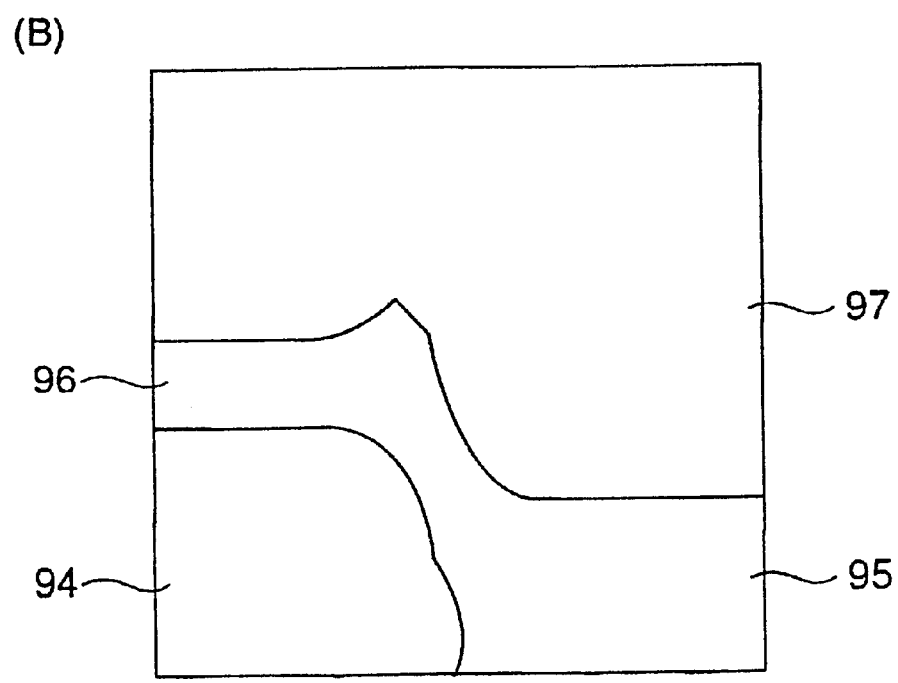

As already explained in FIGS. 7(A) and 7(B), the thin SOI layer 3 is formed in the boundary portion between the SOI layer 3 and the LOCOS oxide layer 4. The nitride layer 93 is formed on the SOI substrate employed in the third embodiment instead of the BOX oxide layer 2. Since the nitride layer does not accelerate oxidization of the silicon layer to the oxide layer, a phenomenon in which the SOI layer 94 as the device portion (channel portion) is oxidized in the upward direction from the nitride layer 93 does not occur. Thus, as indicated in the simulation results shown in FIG. 10(A) and FIG. 1 0(B) which is the enlarged portion of FIG. 10(A), since the boundary portion between the SOI layer 94 and the LOCOS oxide layer 95 is not oxidized in the direction from the lower portion, the SOI layer 94 is formed comparatively thick.

As shown in the above explanation, since the nitride layer 93 is formed in the third preferred embodiment instead of the BOX oxide layer, oxidation in the direction from the lower portion of the SOI layer 94 may be restrained. The result of this is the layer thickness of the SOI layer 94 in the boundary portion between the SOI layer 94 and the LOCOS oxide layer 95 may be maintained. Further, since the conventional BOX oxide layer is simply converted to the nitride layer, the fabricating processes do not increase and implementation may be easily done.

Figure 11:
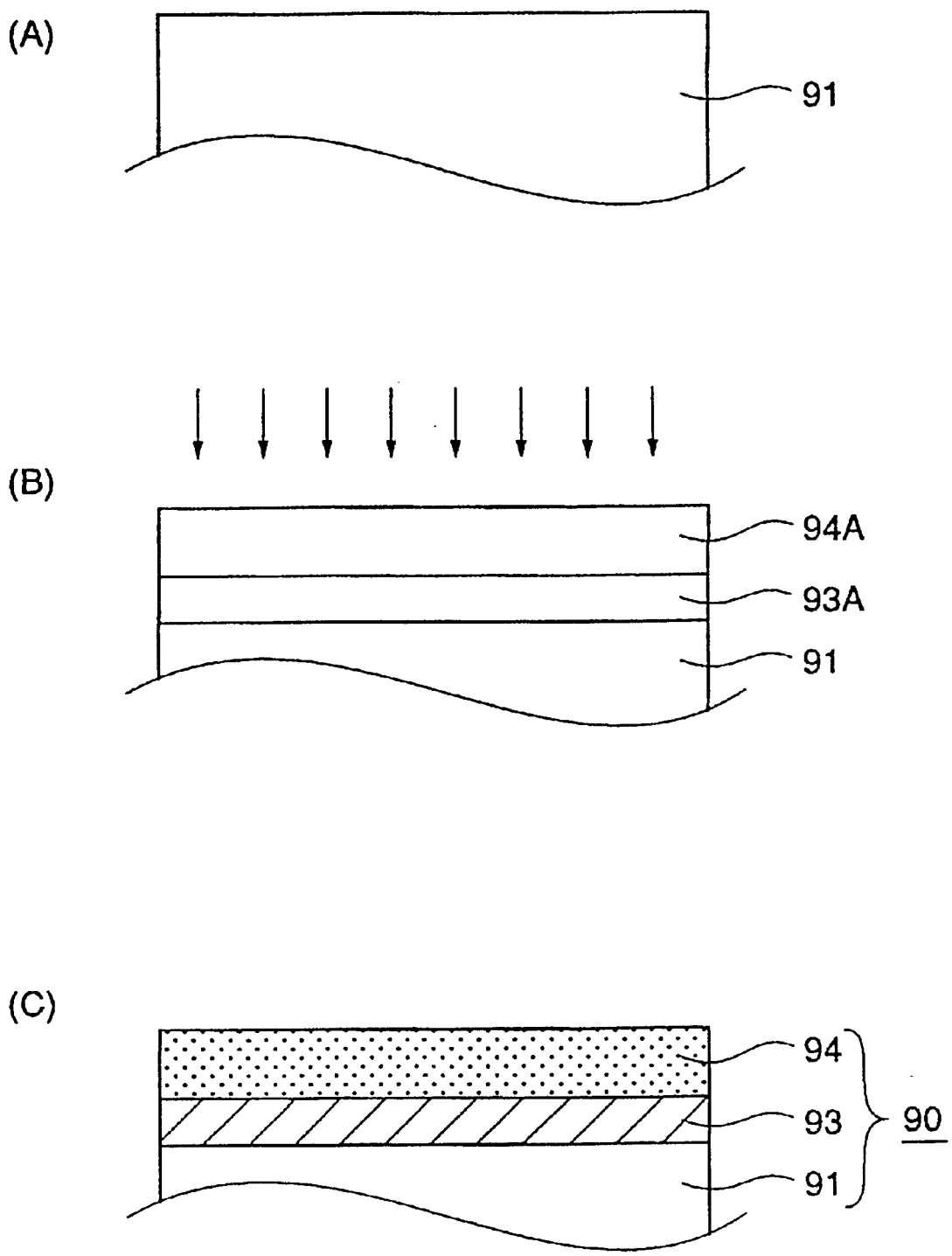
FIGS. 11A–C is a sectional view showing a fabrication method of a SOI substrate of the third preferred embodiment.

FIGS. 11(A) to 11(C) are sectional views showing a fabrication method of a SOI substrate of the third preferred embodiment. Referring to these Figures, the fabrication method of the SOI substrate employed in the third embodiment is explained.

First, the nitride ion is injected into a prepared silicon substrate 9 (FIG. 11(A)). Due to this ion injection, a nitride containing layer 93A is formed in a predetermined deep portion of the silicon substrate 61, and a silicon layer 94A remains on the surface (FIG. 11(B)). The nitride ion injection is controlled so that the nitride containing layer 93A is formed in a portion the depth of which is approximately 500 angstroms to 1650 angstroms from the surface. Since the nitride layer 93 has a characteristic of being warped by heat treatment, the nitride injection is controlled so that the layer thickness of the nitride containing layer 93A is approximately 1150 angstroms. The nitride containing layer 93A is transformed to the nitride layer 93 by heat treatment, and the SOI substrate 90 that is a prerequisite to FIG. 9(A) is formed (FIG. 11(C)).

The fabrication method of the SOI substrate employed in the third embodiment has an advantage where unexpected chemical reactions of oxygen, nitrogen and others can be avoided, compared with the fabrication method of the SOI substrate employed in the second preferred embodiment. Further, since the ion injection is applied only once, advantages exist as the processes are simplified and the processing cost is therefore reduced.

FIGS. 12(A) to 12(D) are sectional views showing a fabrication method of a SOI device of the fourth preferred embodiment. Referring to these figures, the fabrication method of the SOI device of the fourth preferred embodiment is explained.

Figure 12:
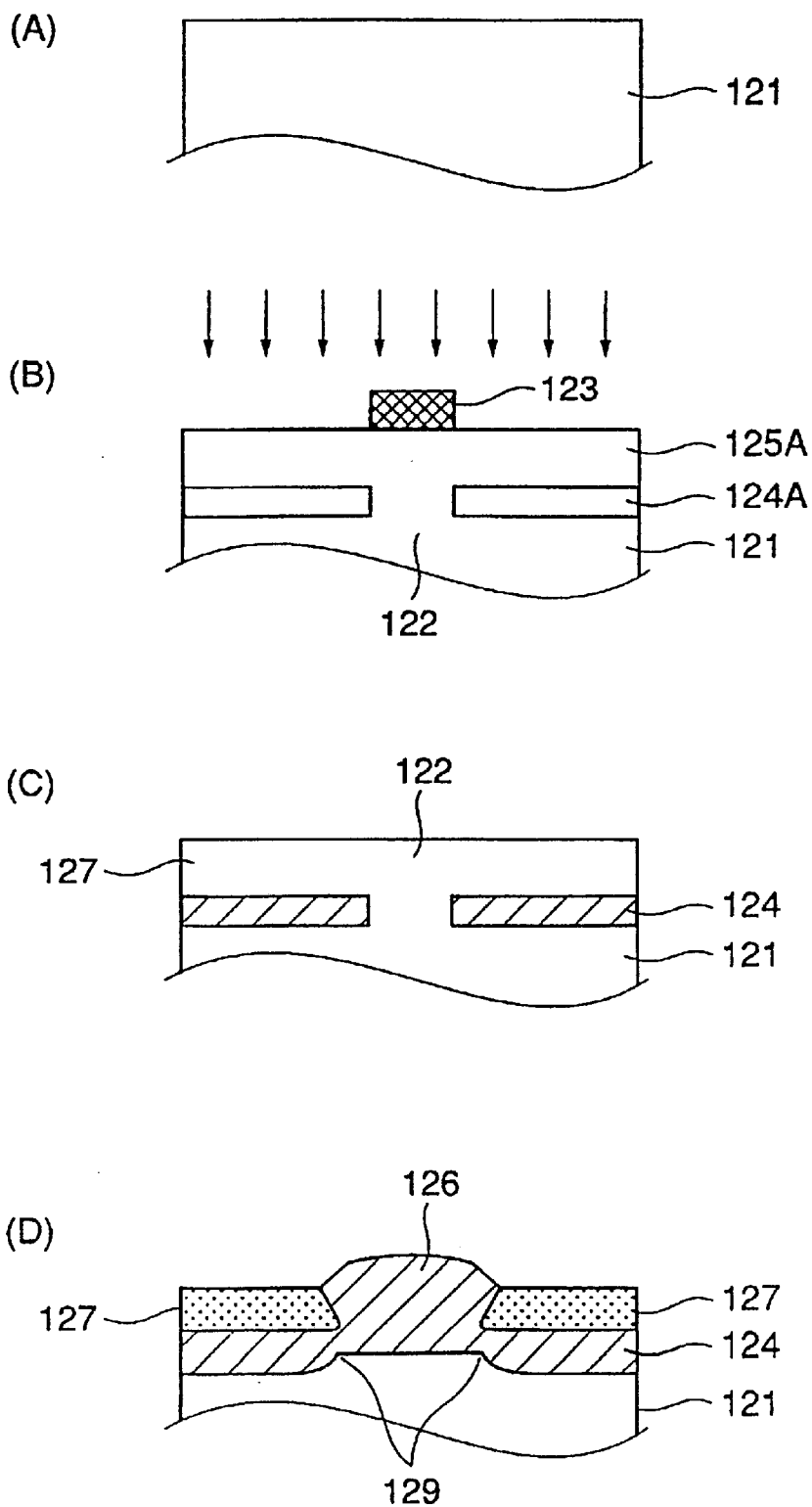
FIGS. 12A–D is a sectional view showing a fabrication method of a SOI device of the third preferred embodiment.

A mask layer 123 is formed on a marginally larger area than a field oxide layer forming plan area 122 of the prepared silicon substrate 121 (FIG. 12(A)). The mask layer 123 is not limited provided it does not allow passage of oxygen ions. The oxygen ion is injected into the silicon substrate 121 in which this mask layer 123 is formed. Due to this ion injection, the oxygen containing layer 124A is formed in a predetermined deep portion of the silicon substrate 121 except the portion in which the mask layer 123 is formed, and a silicon layer 125A remains on the surface (FIG. 12(B)). The oxygen ion injection is controlled so that the oxygen containing layer 124A is formed in a portion the depth of which is approximately 1650 to 3150 angstroms from the surface of the silicon substrate 121.

The oxygen containing layer 124A is then transformed to a BOX oxide layer 124 (FIG. 12(C)) by application of heat treatment. Due to this heat treatment, when the oxygen containing layer 124A is transformed to the BOX oxide layer 124, the BOX oxide layer 124 grows in a lateral direction. Thus, the BOX oxide layer 124 is not formed in the lower portion of the field oxide layer forming plan area 122. Following this, by implementing the LOCOS oxide process, a field oxide layer 126 grows in the downward direction of the silicon substrate 121. The field oxide layer 126 will have a structure in which the BOX oxide layers 124 provided in the silicon substrate are connected (FIG. 12(D)). Because of this, the final shape of the SOI device of the fourth embodiment will have almost the same shape as the case in which the SOI device is formed with the SIMOX substrate having the conventional BOX oxide layer. Observing a section in detail, as shown in FIG. 12(D), the end portions of the field oxide layer 126, namely, the boundary portions of the BOX oxide layer 124 formed in the silicon substrate 121 form a slit-like portion 129. This shows the field oxide layer 126 growing in the downward direction. Since the field oxide layer grows in the downward direction, the growth in the lateral direction decreases compared with that when the conventional SIMOX substrate is employed. Because of this, oxidation in the direction from the lower portion is mitigated and a form with a relatively thick layer is obtained in the boundary condition between the field oxide layer 126 and a SOI layer 127.

Figure 13:
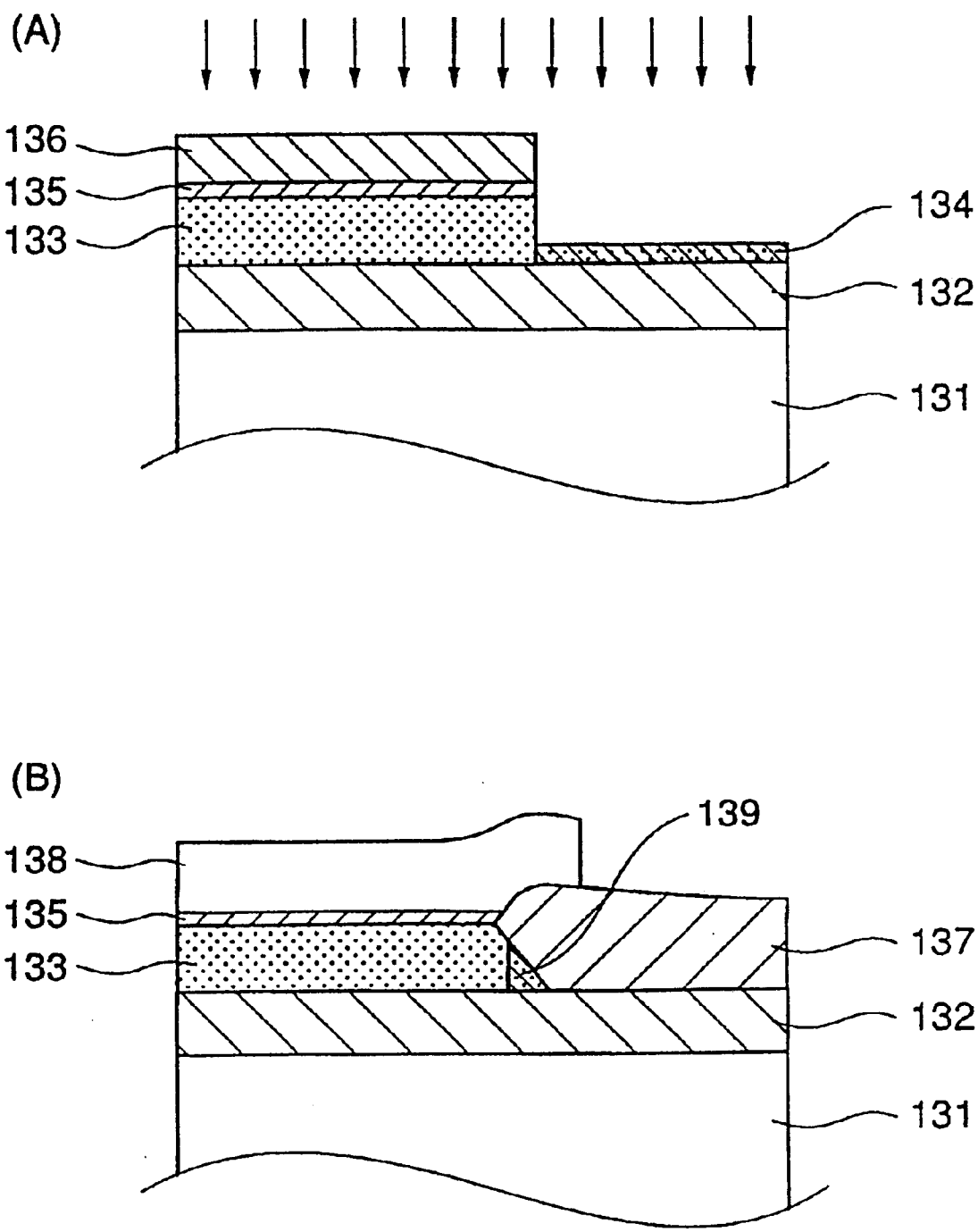
FIGS. 13A–B is a sectional view showing a fabrication method of a SOI device of the fourth preferred embodiment.

FIGS. 13(A) and 13(B) are sectional views showing a fabrication method of a SOI device of the fifth preferred embodiment. Referring to these figures, the fabrication method of the SOI device of the fifth preferred embodiment is explained.

A SIMOX substrate is prepared in which a SOI layer 133 the layer thickness of which is approximately 500 angstroms and a BOX oxide layer 132 the layer thickness of which is approximately 1000 to 1500 angstroms are layered and formed on a silicon substrate 131. A gate oxide layer 135 the layer thickness of which is approximately 70 angstroms and a nitride layer 136 the layer thickness of which is approximately 500 angstroms are successively formed on the SOI layer 133 of this SIMOX substrate. The layer thickness of the SOI layer 133 decreases to approximately 400 angstroms because of the gate oxide layer 135 forming and subsequent processing, etc. Next, a part of the region of the SOI layer 133, the gate oxide layer 135, and the nitride layer 136 forming a LOCOS oxide layer 137 is eliminated. The volume of the SOI layer 133 eliminated is approximately 300 angstroms which is ¾ of the original layer thickness of approximately 400 angstroms, in the same way as the fabrication method of the first preferred embodiment. Thus, the layer thickness of the SOI layer after elimination becomes approximately 100 angstroms which is ¼ of the layer thickness of the original SOI layer 133.

Following this, impurities are implanted into the whole substrate using the nitride layer 136 as the mask (FIG. 13(A)). Due to this implant, impurities are introduced into the SOI layer 134 as the field oxide layer forming plan area which then becomes a high density region. The SOI layer 134 is transformed to the LOCOS oxide layer 137 by implementation of the LOCOS oxide process. Further, a gate polysilicon 138 is formed after the nitride layer 136 is eliminated, and the final SOI device structure is obtained (FIG. 13(B)). A high density region 139 is formed in the lower portion of the triangle portion of the SOI layer 133 formed in the boundary portion between the SOI layer 133 and the transformed LOCOS oxide layer 137. This is a portion of the high density region of the SOI layer 134 remaining. A part of the high density region does not work as a MOS because a channel portion becomes a high density region even if the parasite MOS structure is formed.

Since a high density region exists in a portion with a thin SOI layer 133 thickness, electric influence by the parasite MOS is eliminated, and the bump properties can be eliminated. Although the SOI layer as the field oxide layer forming plan area is reduced to ¼ of the original SOI layer in the same way as the fabrication method of the first preferred embodiment, in the fourth preferred embodiment this elimination volume is capable of being less than ¾ because the high density region is formed.

Figure 14:
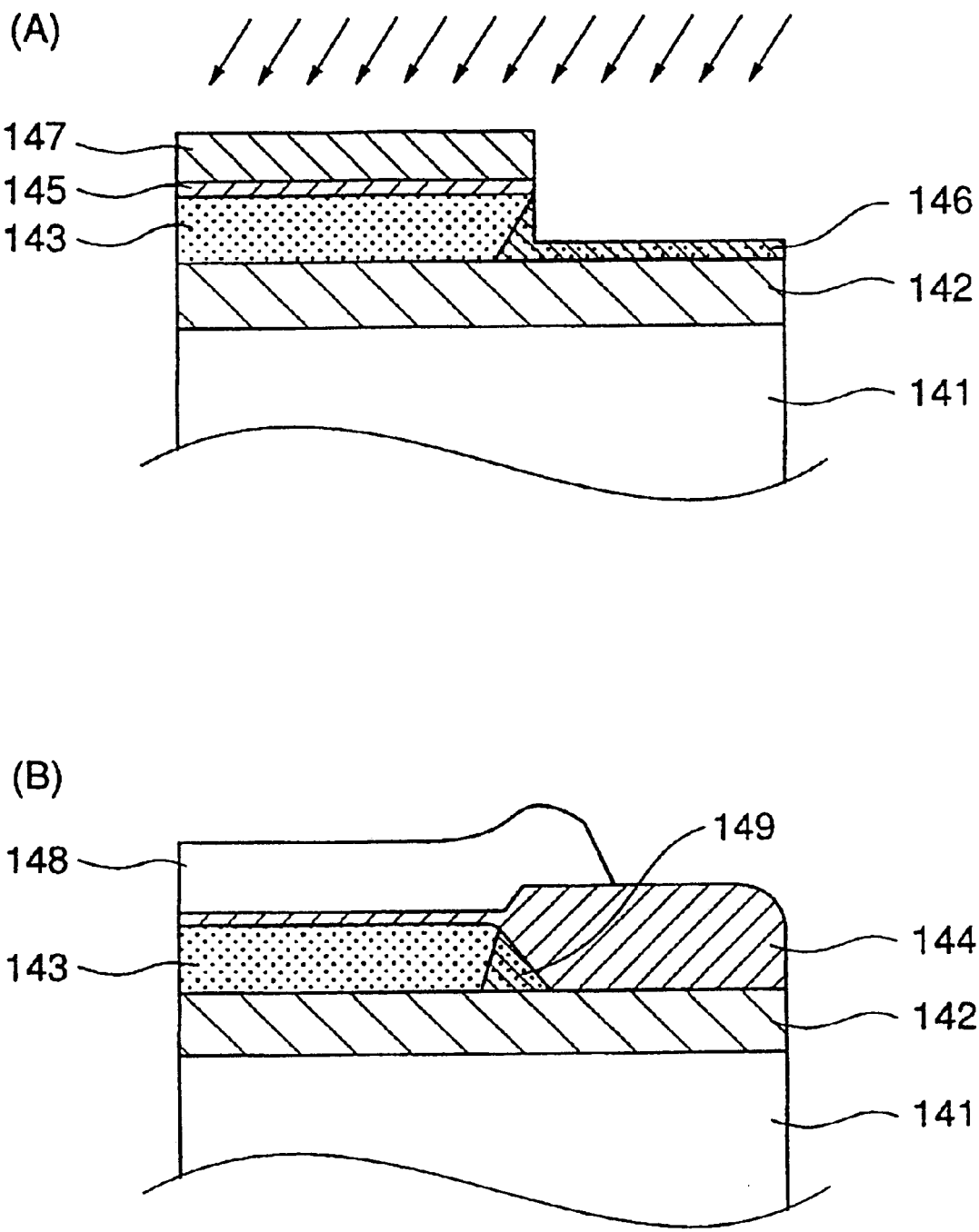
FIGS. 14A–B is a sectional view showing a modified example of a fabrication method of a SOI device of the fifth preferred embodiment.

FIGS. 14(A) and 14(B) are sectional views showing a modified example of a fabrication method of a SOI device of the fifth preferred embodiment. Referring to these figures, the modified example of the fabrication method of the SOI device of the fifth preferred embodiment is explained.

After a gate oxide layer 145 and a nitride layer 147 are successively formed on the SIMOX substrate, elimination of a part of the nitride layer 147 as a LOCOS oxide layer forming plan area, a gate oxide layer 145, and a SOI layer 143 is processed in the same way as in FIG. 13(A). Impurities are obliquely implanted into the whole substrate using the nitride layer 147 as the mask (FIG. 14(A)). By this oblique implantation, impurities are introduced in the end portions of the SOI layer 134 as the field oxide layer forming plan area and the SOI layer 133 as the channel portion, in order to form a high density region 146.

Following this, the high density region 146 is transformed to a LOCOS oxide layer 144 by implementation of the LOCOS oxide process. Further, a gate polysilicon 148 is formed and a final SOI device structure is attained after the nitride layer 147 is eliminated (FIG. 14(B)). A high density region 149 larger than the high density region 139 shown in FIG. 13(B) is formed in the lower portion of the triangle portion of the SOI layer 143 formed in the boundary portion between the SOI layer 143 and the transformed LOCOS oxide layer 144. This is because the high density region is formed in the end portion of the SOI layer 143 of the channel portion by the oblique implantation. The high density region does not function as MOS in the same way as shown in FIG. 13(B) because the channel portion becomes the high density region even if the parasite MOS structure is formed.

Figure 15:
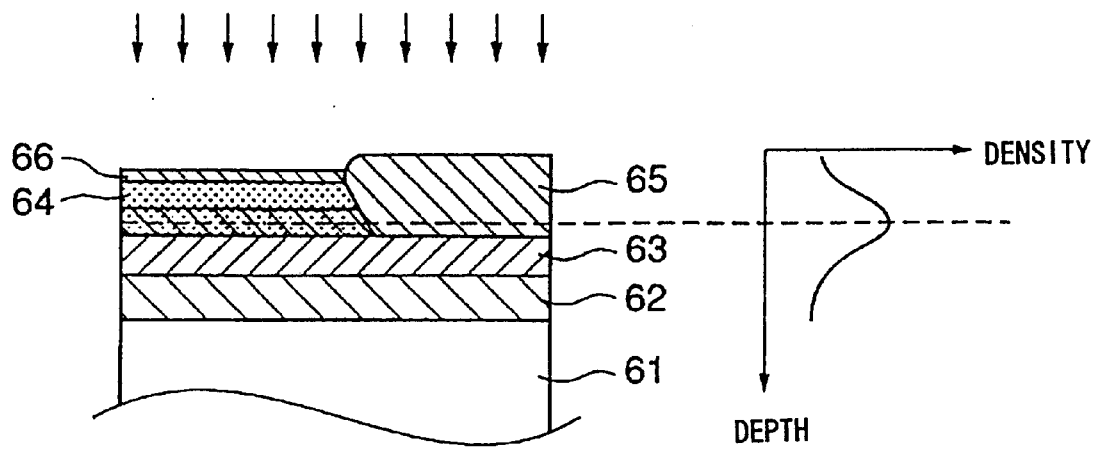
FIG. 15 is a sectional view showing a fabrication method of a SOI device of the sixth preferred embodiment.

Since the high density region the size of which is enlarged compared to that of FIG. 13(B) exists in a portion with a thin layer SOI layer 143, electric influence by the parasite MOS is reduced, and the bump properties can be improved. According to this modified example, it is no problem that the elimination volume of the SOI layer 143 may be decreased compared to that of the fifth preferred embodiment as shown in FIGS. 13(A) and 13(B). FIG. 15 is a sectional view showing a fabrication method of a SOI device of the sixth preferred embodiment. Referring to this Figure, the fabrication method of the SOI device of the sixth preferred embodiment is explained. A SOI device is formed on the SOI substrate employed in the second preferred embodiment in the same way as the second preferred embodiment. Thus, the SOI device structure of FIG. 15 is the same as FIG. 6(B) except for forming the polysilicon 67. The fabrication method of the sixth preferred embodiment applies a threshold value control implant to the SOI device, the structure of which is shown in FIG. 6(B). Energy of this threshold value control implant is controlled so that the peak value of impurities is lower than the SOI layer 64 as shown in the graph on the right hand side of FIG. 15. To give an actual example, a predetermined threshold voltage is capable of being obtained in the portion used as the channel of the SOI layer 64. Further implantation is possible using a combination of implantation energy and the dosing volume of impurities in order for impurity density to become higher in the SOI layer 64 and especially in the lower portion of the boundary portion of a field oxide layer.

In the sixth embodiment, there is an advantage where threshold voltage control and hump property improvement are implemented at the same time due to the above described implantation processes being installed. It is acceptable that the whole lower portion of the SOI layer 64 becomes the high density impurity layer because the layer thickness of the SOI layer 64 necessary to control the threshold value is maintained. Although the SOI substrate of the sixth embodiment is the same as the SOI substrate of the second preferred embodiment, it is possible that the SOI substrate used in the third embodiment or a conventional SIMOX substrate can be used.

Figure 16:
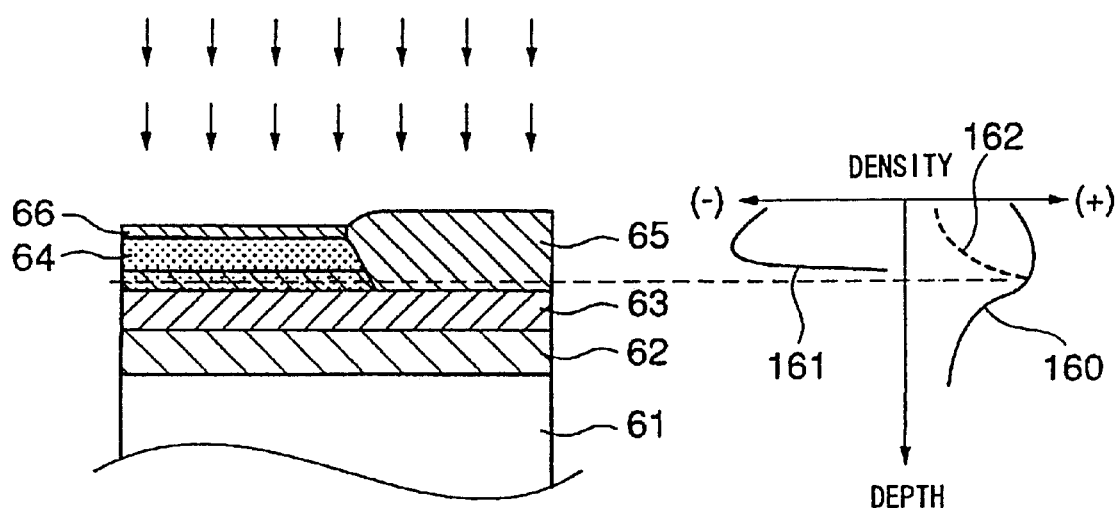
FIG. 16 is a sectional view showing a modified example of a fabrication method of a SOI device of the sixth preferred embodiment.

FIG. 16 is a sectional view showing a modified example of a fabrication method of a SOI device of the sixth preferred embodiment. Referring to the FIG. 16, the modified example of the fabrication method of the SOI device of the sixth preferred embodiment is explained.

In the modified example, the SOI device is formed in the same way as the sixth preferred embodiment in which the threshold value control implant is used. After this, the threshold value control implant is implemented as indicated by the reference number 160 of the graph of FIG. 16. A so-called counter dope, in which ions the polarity of which are opposite electrically to ions used in the threshold control implant are doped, is applied with an impurity density profile as shown in the reference number 161 of the graph of FIG. 16. By implementing the impurity implants twice, the SOI layer 64 finally displays the impurity density profile as shown by the reference number 162 of the graph of FIG. 16.

As shown in the above detailed explanation, according to the present invention, current influence, the so-called "hump property," by the parasite MOS transistor formed in the boundary portion between the LOCOS oxide portion and the SOI layer is capable of being restrained.

What is claimed is:

1. A method of manufacturing a SOI structure semiconductor device comprising the steps of:
   providing a SOI substrate including an insulating oxide layer and a silicon layer formed on the insulating layer;
   forming a gate oxide layer on the silicon layer of the SOI substrate;
   forming a nitride layer on the gate oxide layer;
   selectively removing the nitride layer, gate oxide layer and a part of the silicon layer, removed thickness of which is more than ¾ of the silicon layer within a LOCOS oxide forming area;
   oxidizing the partly removed silicon layer within the LOCOS oxide forming area so that a LOCOS oxide layer is formed; and
   forming a gate electrode on the gate oxide layer.

2. The method of manufacturing the SOI structure semiconductor device according to claim 1, wherein the thickness of the silicon layer of the SOI substrate is about 400 to 500 angstroms.

3. The method of manufacturing the SOI structure semiconductor device according to claim 1, wherein the thickness of the partly removed portion of the silicon layer is about 100 angstroms.

4. The method of manufacturing the SOI structure semiconductor device according to claim 1, wherein the thickness of said insulating oxide layer of the SOI substrate is about 1000 to 1500 angstroms.

5. The method of manufacturing the SOI structure semiconductor device according to claim 1, further comprising a step of introducing an impurity into the partly removed silicon layer within the LOCOS oxide forming area.

6. The method of manufacturing the SOI structure semiconductor device according to claim 1, further comprising a step of obliquely introducing an impurity into the partly removed silicon layer within the LOCOS oxide forming area and the silicon layer adjacent to the LOCOS oxide forming area.

7. A method of manufacturing a SOI structure semiconductor device comprising the steps of:
   providing a SOI substrate including an insulating oxide layer and a silicon layer formed on the insulating layer;
   forming a gate oxide layer on the silicon layer of the SOI substrate;
   forming a nitride layer on the gate oxide layer;
   obliquely removing the nitride layer, the gate oxide layer and a part of the silicon layer within a LOCOS oxide forming area so that the part of the silicon layer is removed widely than the nitride layer;
   oxidizing the partly removed silicon layer within the LOCOS oxide forming area so that a LOCOS oxide layer is formed; and
   forming a gate electrode on the gate oxide layer.

8. The method of manufacturing the SOI structure semiconductor device according to claim 7, wherein removed thickness of the partly removed portion of the silicon layer is about ½ of the thickness of the unremoved silicon layer.

9. The method of manufacturing the SOI structure semiconductor device according to claim 7, wherein the thickness of the silicon layer of the SOI substrate is about 400 to 500 angstroms.

10. The method of manufacturing the SOI structure semiconductor device according to claim 7, wherein the thickness of said insulating oxide layer of the SOI substrate is about 1000 to 1500 angstroms.

11. A method of manufacturing a SOI substrate comprising steps of:
   providing a silicon substrate having a surface thereof;
   introducing oxygen ions into the silicon substrate from the surface of the silicon substrate so that an oxygen containing layer is formed in the silicon substrate positioned at a first depth from the surface of the silicon substrate;
   introducing nitrogen ions into the silicon substrate from the surface of the silicon substrate so that a nitrogen containing layer is formed in the silicon substrate positioned at a second depth from the surface of the silicon substrate which is closer to the surface of the silicon substrate than the first depth; and
   subjecting the silicon substrate including the oxygen containing layer and the nitrogen containing layer to a heat treatment so that the oxygen containing layer and the nitrogen containing layer are transformed to an insulating oxide layer and an insulating nitride layer, respectively.

12. The method of manufacturing the SOI substrate according to claim 11, wherein the first depth is about 1650 to 3150 angstroms from the surface of the silicon substrate.

13. The method of manufacturing the SOI substrate according to claim 11, wherein the second depth is about 500 to 1650 angstroms from the surface of the silicon substrate.

14. A method of fabricating a semiconductor structure, comprising:

providing a semiconductor substrate including a base semiconductor substrate having a main surface, an insulating layer formed on the main surface of the base semiconductor substrate, and a silicon layer formed on the insulating layer;

forming a gate insulating layer on the silicon layer;

forming an anti-oxidation layer on the gate insulating layer;

selectively removing the anti-oxidation layer, the gate insulating layer and a part of the silicon layer within an oxidation layer formation area to obtain a resultant structure;

oxidizing the resultant structure to form an oxidation layer within the oxidation layer formation area such that a portion of the silicon layer which contacts the oxidation layer defines a triangular cross-section with a height side to base side ratio of 4:1 or less, wherein an oblique side of the triangular cross-section is a boundary line between the silicon layer and the oxidation layer, wherein the height side of the triangular cross-section extends at a right angle from the insulating layer to one end of the boundary line, and wherein the base side extends along the insulating layer from the height side to the other end of the boundary line;

removing the anti-oxidation layer to expose the gate insulating layer; and forming a gate electrode on the exposed gate insulating layer.

15. The method of fabricating a semiconductor structure according to claim 14, wherein a removed thickness of the silicon layer is about ¾ of an original thickness of silicon layer.

16. The method of fabricating a semiconductor structure according to claim 15, wherein the original thickness of the silicon layer is about 400 to 500 angstroms.

17. The method of fabricating a semiconductor structure according to claim 14, wherein a thickness of the partly removed portion of the silicon layer is about 100 angstroms.

18. The method of fabricating a semiconductor structure according to claim 14, wherein the thickness of the insulating layer of the semiconductor substrate is about 1000 to 1500 angstroms.

19. The method of fabricating a semiconductor structure according to claim 14, wherein the thickness of the anti-oxidation layer is about 500 angstroms.

20. The method of fabricating a semiconductor structure according to claim 14, wherein the anti-oxidation layer is a nitride layer.

21. A method of manufacturing a semiconductor on insulator structure, comprising:

providing a semiconductor on insulator substrate including a base substrate having a main surface, an insulator layer formed on the main surface of the base substrate, and a silicon layer formed on the insulator layer;

forming a gate insulating layer on the silicon layer;

forming an anti-oxidation layer on the gate insulating layer;

selectively removing the anti-oxidation layer, the gate insulating layer and a part of the silicon layer within an oxidation layer formation area to obtain a resultant structure, wherein a removed thickness of the silicon layer is about ¾ of an original thickness of the silicon layer; and oxidizing a remaining portion of the silicon layer to form an oxidation layer within the oxidation layer formation area such that a portion of the silicon layer which contacts the oxidation layer defines a triangular cross-section with a height side to base side ratio of 4:1 or less, wherein an oblique side of the triangular cross-section is a boundary line between the silicon layer and the oxidation layer, wherein the height side of the triangular cross-section extends at a right angle from the insulating layer to one end of the boundary line, and wherein the base side extends along the insulating layer from the height side to the other end of the boundary line.

22. The method of manufacturing a semiconductor on insulator structure according to claim 21, wherein the thickness of the silicon layer is about 400 to 500 angstroms.

23. The method of manufacturing a semiconductor on insulator structure according to claim 21, wherein the thickness of the partly removed portion of the silicon layer is about 100 angstroms.

24. The method of manufacturing a semiconductor on insulator structure according to claim 21, wherein the thickness of the insulating layer of the semiconductor substrate is about 1000 to 1500 angstroms.

25. The method of manufacturing a semiconductor on insulator structure according to claim 21, wherein the thickness of the anti-oxidation layer is about 500 angstroms.

26. The method of manufacturing a semiconductor on insulator structure according to claim 21, wherein the anti-oxidation layer is a nitride layer.

27. The method of manufacturing a semiconductor on insulator structure according to claim 26, further comprising:

removing the anti-oxidation layer to expose the gate insulating layer after said oxidation; and forming a gate electrode on the exposed gate insulating layer.

* * * * *